United States Patent [19]

Reynolds et al.

[11] Patent Number: 4,491,806

[45] Date of Patent: Jan. 1, 1985

[54] RESONANT CAVITY WITH INTEGRATED MICROPHONIC SUPPRESSION MEANS

[75] Inventors: Gary R. Reynolds, Oakwood Hills; Thomas R. Gaynor, Arlington Heights; Raul Olivera, Itasca; Ross E. Ruthenberg, Wooddale; Jay G. Smith, Hoffman Estates; Christopher N. Kurby, Elmhurst; Terry K. Mansfield, Palatine, all of Ill.

[73] Assignee: Motorola, Inc., Schaumburg, Ill.

[21] Appl. No.: 433,066

[22] Filed: Oct. 6, 1982

[51] Int. Cl.[3] .......................... H01P 7/04; H01P 7/06; H03B 1/02

[52] U.S. Cl. ...................................... 331/96; 331/101; 331/107 DP; 331/107 C; 333/222; 333/226

[58] Field of Search .................. 331/96, 101, 107 DP, 331/107 C; 333/222, 223, 224, 226

[56] References Cited

U.S. PATENT DOCUMENTS

| | | | |
|---|---|---|---|
| 3,290,595 | 12/1966 | Novotny | 324/120 |
| 3,448,412 | 6/1969 | Johnson | 333/82 |
| 3,537,041 | 10/1970 | Kommrusch | 333/73 |
| 3,624,146 | 11/1971 | Kaneko | 331/96 |
| 3,649,917 | 3/1972 | Schoep et al. | 331/96 X |
| 4,021,755 | 5/1977 | Svensson | 331/96 |
| 4,097,817 | 6/1978 | Thoren et al. | 331/56 |
| 4,228,539 | 10/1980 | Hamalainen | 455/124 |
| 4,292,610 | 9/1981 | Makimoto et al. | 333/222 |

FOREIGN PATENT DOCUMENTS

| | | | |
|---|---|---|---|
| 2247803 | 4/1974 | Fed. Rep. of Germany | 333/223 |
| 0801155 | 1/1981 | U.S.S.R. | 333/223 |

*Primary Examiner*—Eugene R. LaRoche
*Assistant Examiner*—D. C. Mis
*Attorney, Agent, or Firm*—Donald B. Southard; James W. Gillman; Edward M. Roney

[57] ABSTRACT

The invention is a microphonics suppression means for a high frequency resonant cavity. The resonant cavity is used in a RF oscillator to generate UHF/VHF frequencies. The resonant cavity comprises an outer wall portion, a center conductor portion, a tuning slug and a plurality of coupling probes. The coupling probes, tuning slug and center conductor are held in a fixed relationship by a microphonics suppression means made of a low dielectric material which fits over and around the center conductor and encapsulates the coupling probes and collars the tuning slug. The microphonics suppression means reduces the effect of microphonics on the output signal of the RF oscillator, thus allowing a clean output signal suitable for high power applications.

23 Claims, 4 Drawing Figures

RESONANT CAVITY WITH INTEGRATED MICROPHONIC SUPPRESSION MEANS

BACKGROUND OF THE INVENTION

This invention deals with integrated microphonic suppression means for a resonant cavity. The cavity resonator of the invention is utilized as a frequency determining element in a semiconductor oscillator to produce high power radio energy at VHF/UHF frequencies.

In an RF oscillator employing a gas filled cavity resonator, microscopic dimensional changes resulting from external shocks and vibrations will cause undesired RF frequency deviations (microphonics). In the past microphonics have not been a serious problem since most VHF/UHF oscillators have utilized stripline transmission lines as resonating elements. Because of the relatively low Q value of stripline transmission lines, these devices give spurious sideband noise performance that is unacceptable in many high power RF oscillator applications. Cavity resonators offer much better performance characteristics than stripline resonators when used with RF oscillators at VHF/UHF frequencies. Unfortunately cavity resonators, when coupled to RF oscillators, are very susceptible to microphonics.

In a coaxial cavity resonator used in a RF oscillator the dimensions most sensitive to microphonics are (1) the tuning screw penetration into the resonator, (2) the gap between the tuning screw and the resonator center conductor, and (3) the gaps between the center conductor and the coupling probes. The invention yields a cavity resonator having negligible microphonics while maintaining a satisfactory quality factor. An RF oscillator using this type of cavity as a resonating device will exhibit low residual FM hum and noise under shock and vibration conditions, while maintaining the superior sideband performance inherent in a high Q cavity resonator oscillator.

It is an object of this invention to limit the mechanical displacements in a cavity resonator oscillator: specifically limiting displacements between the tuning screw, coupling probes and resonator center conductor to acceptable levels and thereby minimizing the effects of microphonics.

It is a further object of this invention to maintain acceptable RF performance of the cavity oscillator while simultaneously limiting the mechanical displacements of the various oscillator component parts.

SUMMARY OF THE INVENTION

Briefly, the invention is a microphonics suppression means for a high frequency resonant cavity. The resonant cavity is used in a RF oscillator to generate UHF/VHF frequencies. The resonant cavity comprises an outer wall portion, a center conductor portion, a tuning slug and a plurality of coupling probes. The coupling probes, tuning slug and center conductor are held in a fixed relationship by a microphonics suppression means made of a low dielectric material which fits over and around the center conductor and encapsulates the coupling probes and collars the tuning slug. The microphonic suppression means reduces the effect of microphonics on the output signal of the RF oscillator, thus allowing a clean output signal suitable for high power applications.

DESCRIPTION OF THE PREFERRED EMBODIMENT

Figure 1:
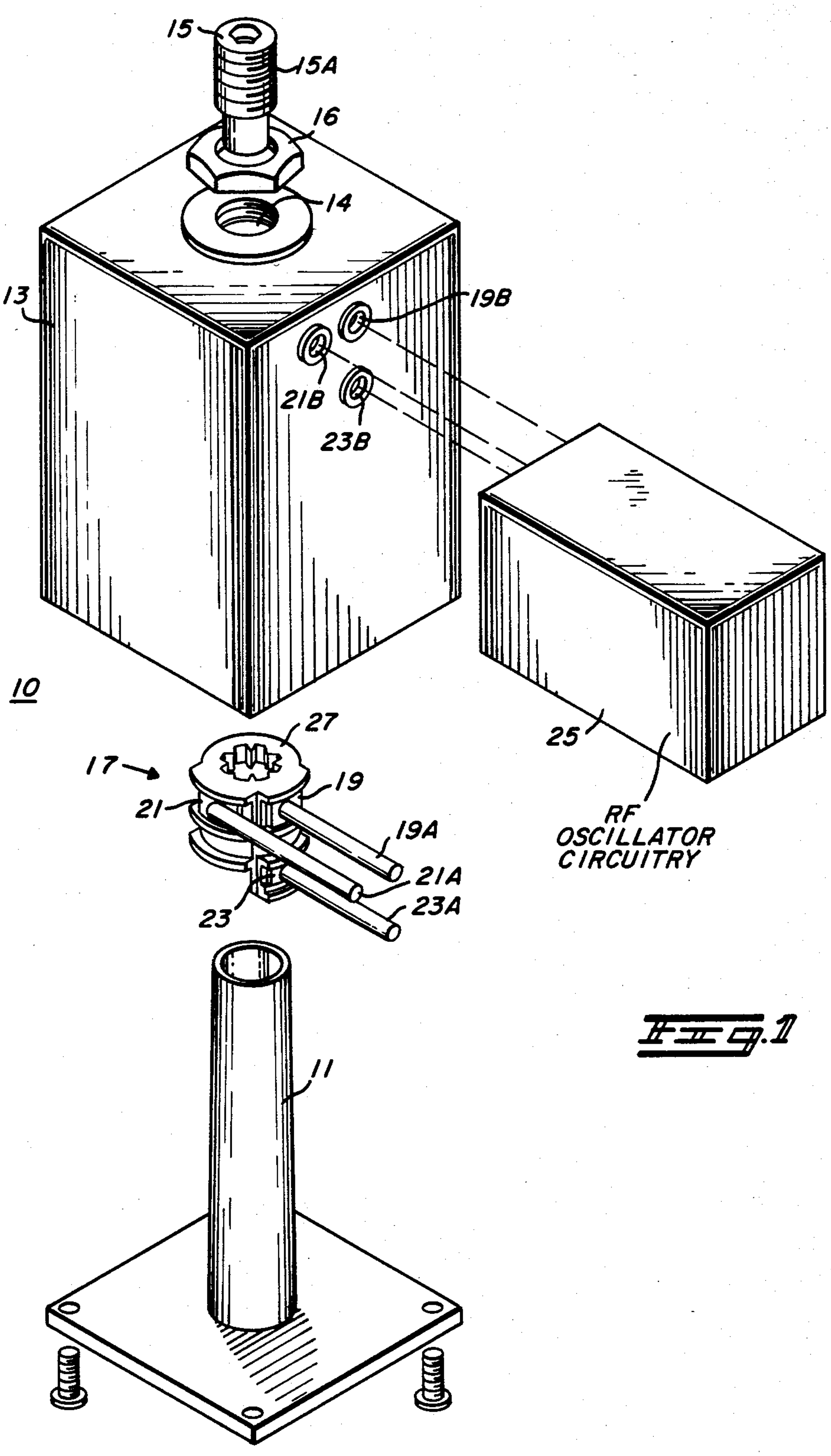
FIG. 1 is an exploded view of the cavity resonator according to the invention.

FIG. 1 shows an exploded view of a cavity resonator RF oscillator employing the integrated microphonics suppression means according to the invention. The cavity resonator 10 consists of a center conductor portion 11, an outer wall portion 13, a slug 15 and encapsulated probe assembly 17. The tuning slug 15 has a threaded portion 15*a* which mates with a threaded hole 14 in the top of the cavity resonator outer wall portion 13. A threaded nut 16 fits over the tuning slug 15 and is turned down to an engagement position with the top of the outer wall portion 13. Probes 19, 21 and 23 in the encapsulated probe assembly 17 couple the cavity resonator 10 to the RF oscillator 25. Leads 19*a*, 21*a* and 23*a* connect the probes 19, 21 and 23 to the RF oscillator 25. Each of the probes 19, 21 or 23 and its associated lead 19*a*, 21*a* or 23*a* are preferably formed as one integral piece of a conductive metal such as a die cast zinc alloy. In addition, the probes and their associated leads might be plated, with copper for example, to improve conductivity. Without the encapsulated probe assembly 17 the probes 19, 21 and 23 and leads 19*a*, 21*a* and 23*a* are only secured at the end of the leads at holes 19*b*, 21*b* and 23*b*. As such, the probes and their associated leads are cantilevered. Accordingly, without the encapsulated probe assembly 17 the probes are susceptible to microscopic movement in response to environmental physical vibration and shock.

In the resonant cavity of FIG. 1, as it is applied to an RF oscillator, the relative spacial positioning of the center conductor 11, the tuning slug 15 and the probes 19, 21 and 23 are critical for optimum performance. The cavity resonator naturally oscillates at a frequency which causes a feedback signal from the RF oscillator 25 through probe 23 to be in phase with the signal being delivered to the RF oscillator 25 by way of probes 19 and 21. Since whether a particular frequency is in phase or out of phase in the resonant cavity is determined by the spacial relationships within the cavity, any relative movement between center conductor 11, tuning slug 15 and probes 19, 21 and 23 will cause a frequency shift at the RF oscillator output that can appear as FM noise or transients on the output signal. Solutions of equations derived from the electrical model of a resonant cavity when used with a RF oscillator indicate that microscopic vibrations at the probes 19, 21 and 23, the center conductor 11 and slug 15 will cause substantial disturbance of the output signal frequency. The encapsulated probe assembly 17 virtually eliminates the effects of microphonics in the resonant cavity 10. By choosing a substance with a suitable dielectric constant, the top of the center conductor 11 can be retained, the probes can be encapsulated and the tuning slug can be precisely positioned relative to the center conductor without compromising the electrical properties of the resonator.

Figure 2:
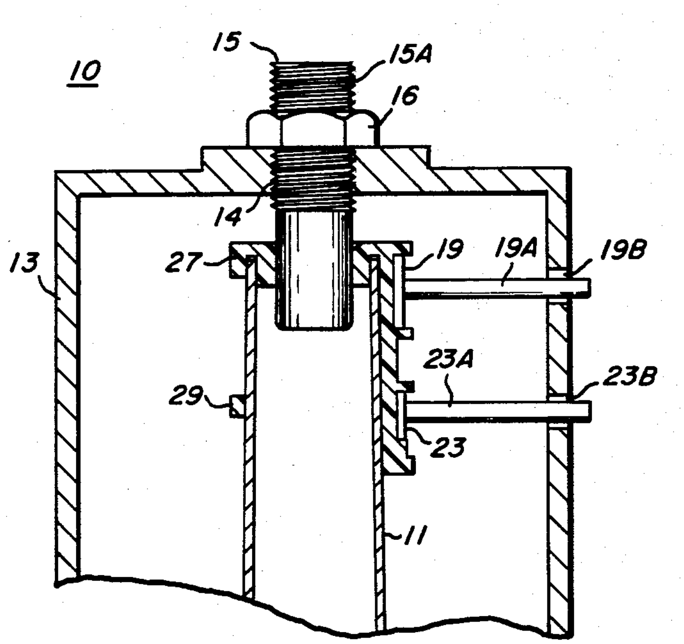
FIG. 2 is a cross-sectional view of the cavity resonator according to the invention.

FIG. 2 is a cross-section of the top portion of the cavity resonator according to the invention. The tuning slug is threaded into the hole in the top of the resonant cavity outer wall portion 13. The end of the tuning slug 15 fits inside the top of center conductor 11. The threaded portion 15*a* of the tuning slug 15 is threaded into the hole 14 and positioned to the proper tuning point. The threaded nut 16 is then tightened over the tuning slug 15 against the top of the outer wall portion 13 of the cavity resonator 10. The threaded nut 16 works to hold the tuning slug 15 in position and prevents movement along its threads when the resonant cavity is subjected to physical vibrations.

Ideally, the center axes of the tuning slug 15 and the center conductor 11 should be coaxial. When the tuning slug 15 and center conductor 11 are coaxial there is equal capacitive coupling between the tuning slug 15 and center conductor 11 at every circumferential point. If the tuning slug 15 and center conductor 11 are not coaxial, then certain portions along the circumference of the tuning slug 15 will have a greater capacitive coupling with the center conductor 11. When shock or vibrations are introduced to such an off center arrangement, the microphonic effect on the output of the RF oscillator is greatly increased over the microphonic effect of the same shock or vibration in a coaxial arrangement. In a coaxial arrangement the capacitive coupling at two points of the tuning slug that are diametrically opposed are equal. When vibrations cause movement of the center conductor 11 or tuning slug 15, the air gap at the first point is decreased thus causing an increased capacitive coupling while the air gap at the second point increases thus causing an offsetting decrease in the capacitive coupling. The deviations of air gap and the changes in capacitive coupling tend to cancel one another when the tuning slug 15 is coaxial with the center conductor 11. In a situation where the tuning slug 15 and center conductor 11 are not coaxial, the vibrational movement causes capacitive increases and decreases at diametrically opposite points that are not of essentially equal and offsetting value. This occurs since the relationship between capacitance and air gap distance is non-linear. When the tuning slug 15 and center conductor 11 are coaxial, the effect of the non-linearity is minimized. Therefore it is important to center the tuning slug 15 in the hollow of the center conductor 11. To achieve reliable and repeatable centering, the encapsulated probe assembly 17 includes a annular collar portion 27 which secures the tuning slug 15 and center conductor 11 in a coaxial relationship. The encapsulated probe assembly 17 also includes a annular ring 29 which secures the lower portion of the assembly 17 around the center conductor 11. The structure of the dielectric material used for the encapsulated probe assembly 17 is designed so as to minimize the amount of dielectric material inside the resonator.

Without the encapsulating probe assembly 17 with its collar 27, the precise positioning of the tuning slug 15 relative to the interior wall of the center conductor 11 would be difficult if not impossible. As can be seen from FIG. 1, the center conductor 11 is a separate casting from the resonant cavity outer wall portion 13. Screws hold the plate portion of the center conductor 11 to the resonant cavity outer wall portion 13. When the encapsulated probe assembly 17 is not included in the cavity resonator 10 the relative positioning of the tuning slug 15 and the center conductor 11 is entirely dependent on the positioning of the plate portion of the center conductor 11. The collar 27 of the encapsulated probe assembly 17 makes possible reliable coaxial alignment of the center conductor 11 and tuning slug 15. The collar 27 of the encapsulated probe assembly 17 also provides a cap from which the probe assembly is accurately positioned along the vertical axis of the center conductor 11. The collar 27 aids the threaded nut 16 in holding the tuning slug 15 in a specific position thus resisting movement of the tuning slug 15 along its threads when the resonant cavity 10 is subjected to physical vibrations. The encapsulated probe assembly 17 fits over the diameter of the center conductor 11 and is pushed down over the center conductor 11 and along its length until the top of the center conductor 11 meets the collar 27 of the encapsulated probe assembly 17.

Figure 3:
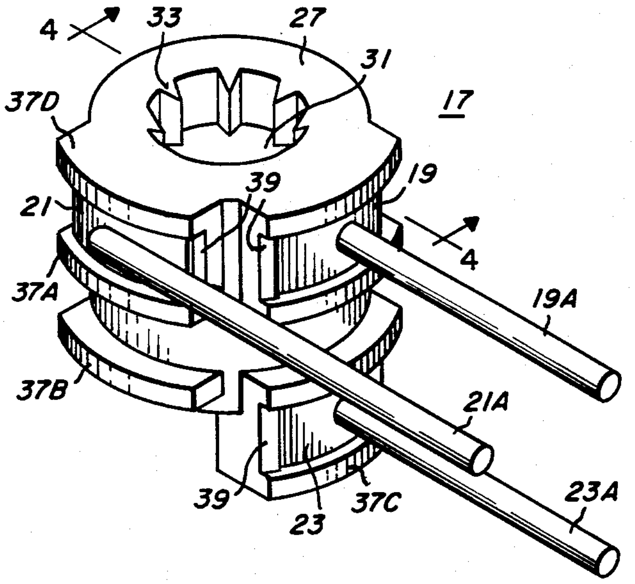
FIG. 3 is a perspective view of the low dielectric collar according to the invention.

FIG. 3 shows a perspective view of the encapsulated probe assembly 17. The dielectric constant of the plastic or insulating material used to construct the encapsulated probe assembly 17 is relatively low. Ideally, the dielectric constant of the material should be the same as air in order to cause minimum electromagnetic distortion within the cavity. Since as a practical matter this is not always possible, there is a need to minimize the quantity of plastic or insulating material inside the cavity. Therefore, an effort has been made to minimize the amount of material used to construct the encapsulated probe assembly 17. This objective is compatible with the objective of making the encapsulated probe assembly fit easily over the top of the center conductor 11. An annular portion 29 together with the collar 27 provide the securing means by which the encapsulated probe assembly 17 is held in position over the center conductor 11.

The collar 27 of the encapsulated probe assembly 17 has an opening 31 to receive the tuning slug 15 of the resonant cavity 10. The collar opening 31 is circular. The edge of the collar defining the opening is shaped in the form of teeth 33. The teeth 33 are preferrably pointed in shape, but could also be rectangular or spheroidal in shape. The teeth 33 are partially crushed upon the initial penetration of the tuning slug 15. This provides an interference fit for the tuning slug 15 in the opening 31 of the collar 27. By having the opening 31 formed by a circular series of pointed teeth 33, the interference fit is only at the points of the teeth 33 in the opening 31. This allows the advantage of achieving an interference fit between the encapsulated probe assembly 17 and the tuning slug 15 without the problem of binding the tuning slug 15 and preventing adjustment of its position. In addition the interference fit allows dimensional tolerances to be sufficiently great so as to allow standard injection molding to be used to form the incapsulated probe assembly 17. The low dielectric material used to form the encapsulated probe assembly 17 is injection molded around the probes 19, 21 and 23. When the low dielectric material cools and hardens the probes 19, 21 and 23 are encapsulated in the molded dielectric. Probe encapsulation is provided by horizontal and vertical rib portions of the dielectric material. The horizontal ribs 37*a*, 37*b* and 37*c* give structural integrity to the encapsulated probe assembly while serving as restraining walls for the probes 19, 21 and 23. Vertical ribs 39 prevent side movement of the probes. A vertical rib 39 is formed on both sides of a probe in order to provide, together with horizontal ribs 37*a*, 37*b* and 37*c*, complete encapsulation of the probe in the low dielectric material. There is a vertical rib portion for each vertical end of each probe. All of the vertical rib portions cannot be seen from the perspective of FIG. 3.

Figure 4:
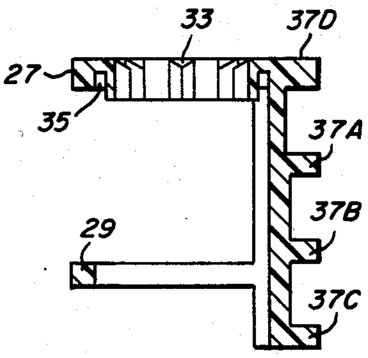
FIG. 4 is a cross-sectional view of the low dielectric collar according to the invention.

FIG. 4 shows a cross-section of the encapsulated probe assembly 17. The collar 27 includes an annular grooved portion 35 which receives the top of the center conductor 11. A portion of the collar 27 is extended to form a horizontal rib 37*d* for aiding in encapsulating the top of probes 19 and 21. The annular ring 29 and annular collar 27 secure the encapsulated probe assembly 17 to the center conductor 11. This allows for the elimination of non-encapsulating dielectric material between the collar 27 and the ring 29, thereby minimizing the dielectric in the resonant cavity.

We claim:

1. A resonant cavity RF oscillator comprising in combination:

a RF oscillator having at least an output, a resonant cavity with a center conductor, coupling means for capacitively coupling said RF oscillator to said center conductor of said resonant cavity, and encapsulating means to encapsulate at least a portion of said coupling means and to secure said coupling means in a fixed spaced relationship to said center conductor thereby avoiding the effects of microphonics at said RF oscillator output.

2. A resonant cavity RF oscillator according to claim 1 wherein said encapsulating means includes a collar portion which fits over the top of said center conductor of said resonant cavity.

3. A resonant cavity RF oscillator according to claim 1 wherein said resonant cavity includes a tuning slug which is received by a central hollow of said center conductor of said resonant cavity.

4. A resonant cavity RF oscillator according to claim 3 wherein said collar portion of said encapsulating means includes an opening to receive said tuning slug and align said tuning slug within said hollow of said center conductor so that the longitudinal axis of said tuning slug is coaxial with the longitudinal axis of said center conductor.

5. A resonant cavity RF oscillator according to claim 3 wherein said collar portion of said encapsulating means includes an opening for receiving said tuning slug, said opening approximating an interference fit with said tuning slug.

6. A resonant cavity RF oscillator according to claim 1 wherein said encapsulating means is formed of an insulating material exhibiting a low dielectric constant.

7. A resonant cavity RF oscillator according to claim 1 wherein said encapsulating mean comprises two annular ring portions connected by an encapsulation portion which holds at least a portion of said coupling means in a fixed relationship.

8. A resonant cavity comprising:

a outer wall portion, a center conductor, input/output means capacitively coupled to said center conductor, encapsulating means to encapsulate at least a portion of said input/output means and to secure said input/output means in a fixed relationship to said center conductor thereby avoiding the effects of microphonics at the input/output means.

9. A resonant cavity according to claim 8 wherein said encapsulating means includes a collar portion which fits over the top of said center conductor.

10. A resonant cavity according to claim 9 including a tuning slug which is received by a central hollow in said center conductor.

11. A resonant cavity according to claim 10 wherein said collar portion of said encapsulating means includes an opening to receive said tuning slug and align said tuning slug within said hollow of said center conductor so that the longitudinal axis of said tuning slug is coaxial with the longitudinal axis of said center conductor.

12. A resonant cavity according to claim 10 wherein said collar portion of said encapsulating means includes an opening for receiving said tuning slug, said opening approximating an interference fit with said tuning slug.

13. A resonant cavity according to claim 8 wherein said encapsulating means is formed of an insulating material exhibiting a low dielectric constant.

14. A resonant cavity according to claim 8 wherein said encapsulating means comprises two annular ring portions connected by an encapsulating portion which holds at least a portion of said coupling means in a fixed relationship.

15. A resonant cavity according to claim 12 wherein said opening is annular with teeth-like projections lining its circumference.

16. A microphonics suppression means for a resonant cavity having a center conductor, tuning slug and coupling probes, said suppression means comprising:

a collar portion for centering said tuning slug within said center conductor, an encapsulating portion for securing said coupling probes in a fixed relationship to said center conductor.

17. A suppression means according to claim 16 wherein said collar portion includes an opening to receive said tuning slug.

18. A suppression means according to claim 16 including a annular portion which fits around the outside perimeter of said center conductor.

19. A suppression means according to claim 17 wherein said opening in said collar portion is lined with teethlike projections which make an interference fit with said tuning slug.

20. A suppression means according to claim 16 which includes a ribbed portion which serves as walls to restrain said coupling probes.

21. A suppression means according to claim 19 wherein said teethlike projections are of a pointed shape.

22. A method for suppressing microphonics in a center conductor resonant cavity comprising the steps of:

(a) capacitively coupling inputs and outputs probes to said center conductor;

(b) capacitively coupling a tuning slug to said center conductor;

(c) encapsulating and holding in a fixed relationship at least a portion of said output probes, said center conductor and said tuning slug.

23. A method for suppressing microphonics in a center conductor resonant cavity according to claim 22 including the step of creating an encapsulating collar around said tuning slug and over said center conductor to enable said tuning slug to be moveable within said center conductor while maintaining the suppression of microphonics.

* * * * *